United States Patent
Park et al.

[11] Patent Number: 6,078,522
[45] Date of Patent: Jun. 20, 2000

[54] NON-VOLATILE SEMICONDUCTOR MEMORY DEVICE

[75] Inventors: Dong-Ho Park, Kyunggi-do; Jong-Min Park, Suwon, both of Rep. of Korea

[73] Assignee: Samsung Electronics, Cp., Ltd., Suwon, Rep. of Korea

[21] Appl. No.: 09/336,282

[22] Filed: Jun. 18, 1999

[30] Foreign Application Priority Data

Jun. 18, 1998 [KR] Rep. of Korea ...................... 98-23017

[51] Int. Cl.⁷ .................................... G11C 16/06

[52] U.S. Cl. .................... 365/185.2; 365/185.2; 365/185.23; 365/200

[58] Field of Search ................ 365/185.2, 200, 365/185.04, 185.23

[56] References Cited

U.S. PATENT DOCUMENTS

| | | | |
|---|---|---|---|
| 4,982,364 | 1/1991 | Iwahashi | 365/189.09 |
| 5,214,604 | 5/1993 | Kato | 365/210 |
| 5,463,587 | 10/1995 | Maruyama | 365/210 |
| 5,822,248 | 10/1998 | Satori et al. | 365/185.21 |
| 5,917,768 | 6/1999 | Pascucci | 365/210 |

*Primary Examiner*—David Nelms
*Assistant Examiner*—Thong Le
*Attorney, Agent, or Firm*—Marger Johnson & McCollom, P.C.

[57] ABSTRACT

A non-volatile memory device of the present invention comprises a memory cell array having a plurality of cells, a plurality of dummy bit lines, a plurality of dummy word lines. At least one of the dummy bit lines includes a bulk tapping for applying bulk voltage. Here, P⁺ impurity is implanted into the dummy bit lines. With this improved memory structure, a device layout area can be reduced and an increase in bulk voltage resulting from hot carriers can be suppressed.

6 Claims, 3 Drawing Sheets

NON-VOLATILE SEMICONDUCTOR MEMORY DEVICE

FIELD OF THE INVENTION

The present invention relates to a non-volatile semiconductor memory device and, more particularly, to a flash memory structure capable of reducing a device layout area and capable of suppressing an increase in bulk voltage.

BACKGROUND OF THE INVENTION

Among programmable, erasable, and readable non-volatile memory devices, a NOR-type flash memory device is known for its high speed programming and reading operation.

FIG. 1 illustrates a cross-sectional view of a typical flash memory cell structure.

A flash memory cell comprises a source 3 and a drain 4, a floating gate 6, and a control gate 8. The $N^+$ source 3 and drain 4 are formed on a P-type semiconductor substrate 2 with a channel region interposed therebetween. The floating gate 6 is formed on the channel region with a thin insulating layer of 100 Å or less interposed therebetween. The control gate 8 is insulated from the floating gate 6 with an insulating layer 9 interposed therebetween. In order to apply voltages for programming, erasing, and reading, power terminals Vb, Vs, Vd, and Vg are respectively connected to the substrate 2, the source 3, the drain 4, and the control gate 8.

Conventionally, in order to program flash memory cells, hot electrons are injected into the floating gate 6 in the channel region adjacent to the drain region 4. The electron injection may be performed by grounding the source region 3 to the P-type semiconductor substrate 2, applying high voltage (10 V) to a control gate electrode Vg, and applying proper amount of voltage (5–6 V) to the drain region 4 so as to generate the hot electrons therein. If the flash memory cells are programmed by the foregoing voltage application, negative charge is stored to the floating gate 6. The negative charge stored to the floating gate 6 raises the threshold voltage of the programmed flash memory cell.

The voltage application for the reading operation is conventionally performed by applying positive voltage (+1 V) to the drain region 4 of the flash memory cell, a predetermined voltage (about 4.5 V) to the control gate electrode Vg, and 0 V to the source region 3. During the reading operation, the programmed flash memory cell that the threshold voltage is raised through the hot electron injection method may prevent current flow from the drain region 4 to the source region 3. The programmed flash memory cells are called 'off cells' and their threshold voltages thereof are distributed in a voltage range of 6–7 V.

For an erasing operation of the flash memory cells, F-N tunneling (Fowler-Nordheim tunneling) is performed from the semiconductor substrate 2 (that is, bulk area) to the control gate 8, so that the flash memory cells can be erased. The F-N tunneling may be performed by applying negative high voltage (−10 V) to the control gate 8 and applying proper positive voltage (5 V) between the bulk area and the control gate 8. In order to maximize erasing, the drain region 4 maintains a high impedance state (for example, floating state). Applying the voltages to the power terminals Vg, Vd, Vs, and Vb for the erasing operation, creates a strong electric field between the control gate 8 and the bulk area. Consequently, the F-N tunneling is performed to emit the negative charge in the floating gate of the programmed cell to the source region 3.

The F-N tunneling is generally performed by applying 6–7 MV/cm field across an insulating layer, e.g., a thin insulating layer of 100 Å or less disposed between the bulk area and the floating gate 6. If the negative charge is emitted from the floating gate 6 to the bulk area by the F-N tunneling, the threshold voltage of the memory cell is lowered during a series of reading operations. In a conventional flash memory structure, each bulk area is connected to a plurality of cells so as to highly integrate the memory cells. If such an erasing operation is performed, the plurality of cells are simultaneously erased. Erasure unit is decided according to an area that each of the bulk area is divided. With constant voltage being applied to the control gate 8 of a cell whose threshold voltage is lowered by the erasing operation, a current path is created from the drain region 4 to the source region. Here, the cell is called 'on cell'-such cells have threshold voltages distributed in a voltage range of 1–3 V.

If a plurality of the memory cells are, however, erased by the F-N tunneling lowering the threshold voltage of the memory cell, the threshold voltage of some memory cells become 0 V or less. This is resulted from uniformity to the threshold voltage of the cells. The cells whose threshold voltage is 0 V or less are called an over-erased cell. The over-erased cell may have 0 V or more through the erase repair operation. The erase repair operation is conventionally performed by grounding a source region of the over-erased memory cell and a P-type substrate region, applying lower amount of voltage (+3 V) to a control gate electrode than during program operation (+10 V), and applying proper amount of voltage (5–6 V) to a drain region. The negative charge is stored in the floating gate of the over-erased cell less than during the programming operation, so that the threshold voltage of the cell is raised to be 0 V and more.

A [TABLE 1] illustrates voltage level applied to the power terminal Vg, Vd, Vs, and Vb during the programming, erasing, and reading operation to the flash memory.

TABLE 1

| Operation mode | Vg | Vd | Vs | Vb |
|---|---|---|---|---|
| Program | +10 V | +5–+6 V | 0 V | 0 V |
| Erasure | −10 V | Floating | Floating | +6 V |
| Erase repair | +3 V | +5–+6 V | 0 V | 0 V |
| Reading | +4.5 V | +1 V | 0 V | 0 V |

FIG. 2 illustrates voltage distribution of a memory cell and FIG. 3 illustrates a cross-sectional view of a memory cell array.

Since a NOR-type flash memory cell should apply positive voltage instead of 0 V to a bulk area during an erasing operation, it cannot share the bulk area with other transistors. It is, therefore, required to form a second well 30 (pocket well) in a first well 20 in the substrate 10. A $P^+$ tapping 33 for applying voltage to the second well 30 is also required as shown in FIG. 3. Consequently, the $P^+$ tapping undesirably increases the layout area.

In addition to this problem, if the resistance is high between the $P^+$ tapping 33 and the cell, not only hot carriers but also hot holes are generated such that electric current flows into second well 30 during the programming operation. The hot carrier and the hot hole increase the electric field of a bulk area and turn on a parasitic bipolar transistor and then the electric field of a drain region decreases. As a result, the programming operation may not be successful because of such "snapback" phenomenon.

SUMMARY OF THE INVENTION

Therefore, it is an object of the present invention to provide a non-volatile semiconductor memory device capable of reducing a device layout area and capable of suppressing an increase in bulk voltage resulting from hot carriers.

According to the object of the present invention, a non-volatile memory device comprises a memory cell array having a plurality of cells arranged with a matrix type of a plurality of main word lines and a plurality of main bit lines, a plurality of dummy bit lines arranged to the column direction adjacent to the memory cell array, a plurality of dummy word lines to the row direction adjacent to the memory cell array, and a bulk tapping for applying bulk voltage to the dummy bit line. Here, $P^+$ impurity is implanted into the dummy bit line.

According to the preferred embodiment, the bulk tapping is connected to the dummy bit line, thereby receiving positive voltage.

According to the preferred embodiment, the dummy bit line and the dummy word line are arranged with the same matrix type as the main bit line and the main word line.

As a result, the device layout area is reduced.

BRIEF DESCRIPTION OF THE DRAWINGS

The present invention may be apparently understood from the detailed description of the preferred embodiment with reference to the accompanying drawings, in which.

DETAILED DESCRIPTION OF PREFERRED EMBODIMENTS

Figure 1:
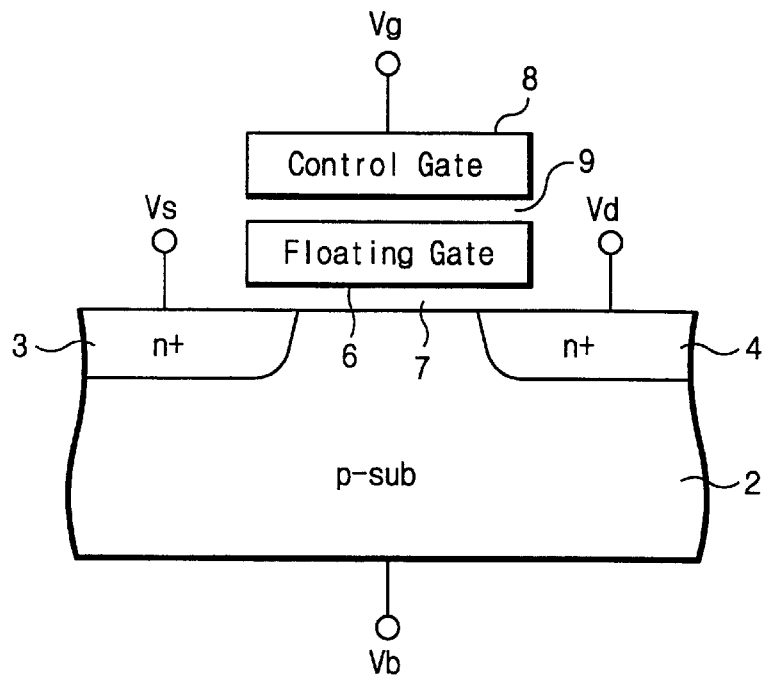
FIG. 1 is a cross-sectional view of a flash memory cell.
Figure 2:
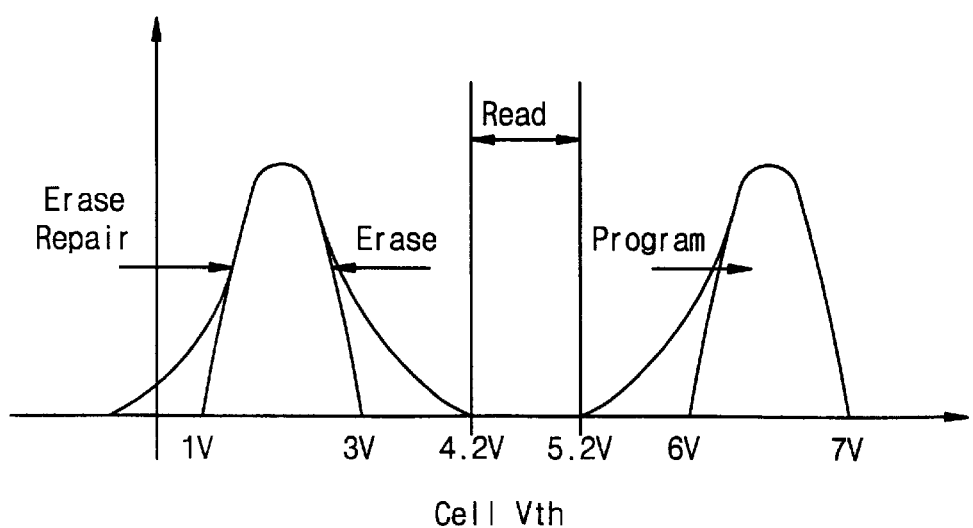
FIG. 2 illustrates the change of threshold voltage of a flash memory cell.

Now, the preferred embodiment of the present invention will be described in detail with reference to accompanying drawings. Hereinafter, the same or similar reference numerals and symbols in the following drawings denote the same or similar elements.

A NOR-type flash memory device of the present invention comprises a plurality of sectors as the basic unit of an erasing operation. Main sectors are arranged at respective intersections of main word lines and main bit lines. Peripheral circuits for programming, erasing, and reading operation of a memory cell array are placed between the sectors. Due to a step difference between the memory cell array and the peripheral circuit regions, cells adjacent to the peripheral circuit do not have the same characteristics as the other cells. In order to reduce the step difference, dummy word lines DW/L1, DW/L2, DW/L3, and DW/L4 and dummy bit lines DB/L1, DB/L2, DB/L3, and DB/L4 are formed adjacent to a memory cell array 100 in pairs. The dummy word lines DW/L1, DW/L2, DW/L3, and DW/L4 and the dummy bit lines DB/L1, DB/L2, DB/L3, and DB/L4 are equal to main word lines (not shown) and main bit lines (not shown).

Figure 5A:
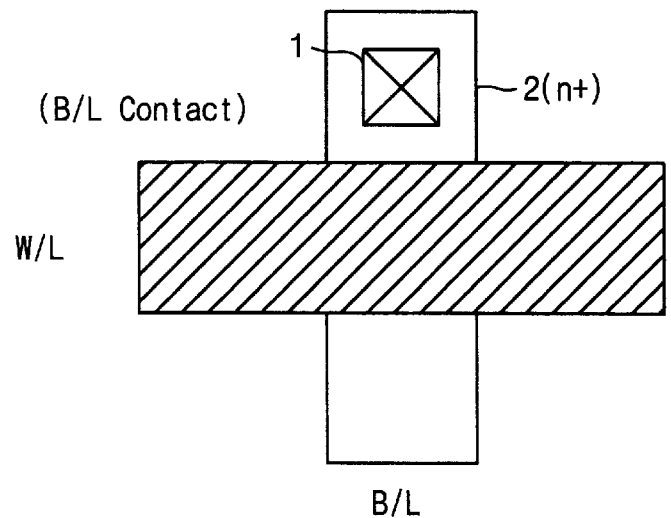
FIGS. 5A–5B illustrate a dummy bit line and a dummy word line according to the present invention.

FIG. 5A illustrates a layout of a bit line and a word line.

A bit line B/L and a word line W/L are arranged perpendicularly. The bit line B/L is made of polysilicon in which impurity is implanted. In order to form a source/drain, $N^+$ impurity is implanted into a cell. Since a NOR flash memory cell should apply positive voltage instead of 0 V to a bulk during an erasing operation, it cannot share the bulk area with other transistors.

Figure 3:
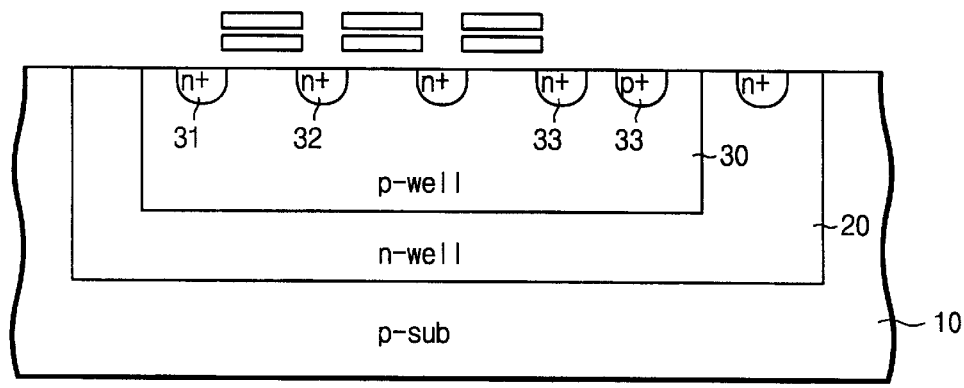
FIG. 3 is a cross-sectional view of a memory cell array.
Figure 4:
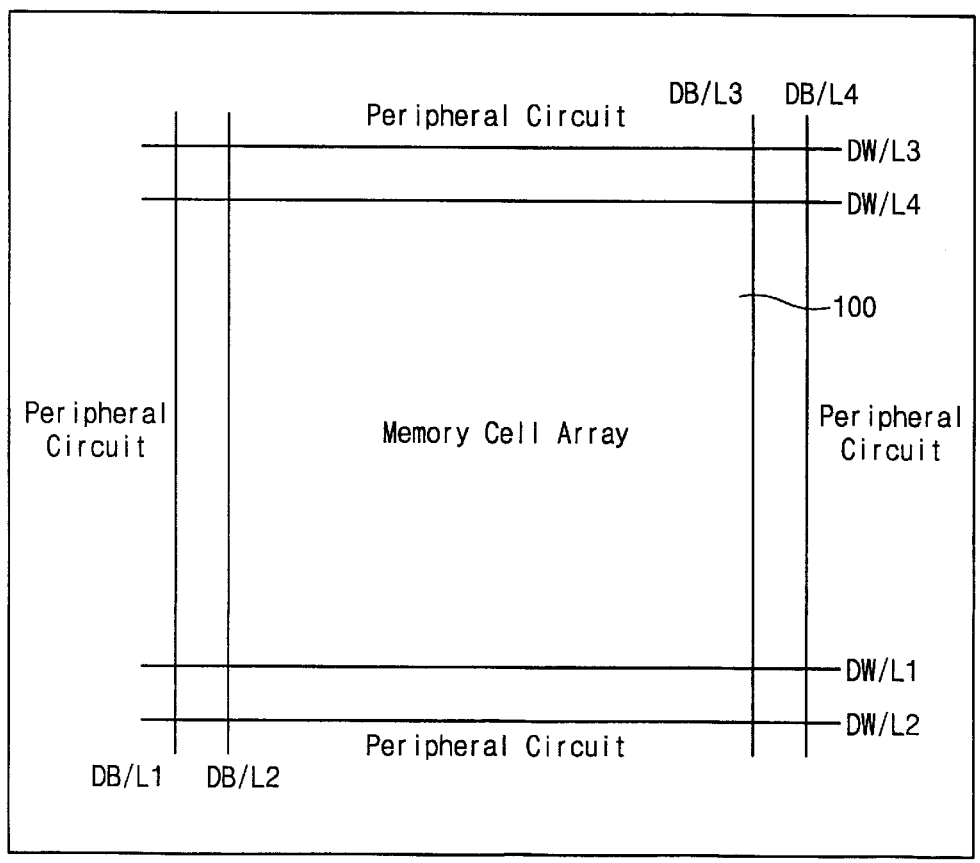
FIG. 4 illustrates a layout of a memory cell array.

It is therefore required to form a second well 30 (pocket well) in a first well 20 in the substrate 10 and a $P^+$ tapping 33 for applying voltage to the second well 30, as shown in FIG. 3. In order to apply bulk voltage, a contact for bulk tapping is additionally formed. The $P^+$ tapping consequently increases the layout area. If the resistance is high between the memory cell and the $P^+$ tapping, hole current flows into a pocket well during a programming operation. Consequently, the electric field of the bulk area increases.

Figure 5B:
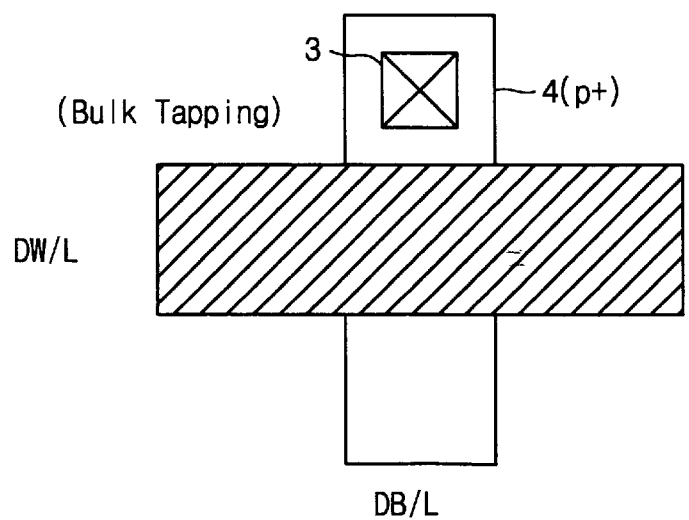

FIG. 5B is sectional view illustrating a layout according to the present invention.

A dummy word line (DW/L) and a dummy bit line (DB/L) are arranged perpendicularly. The dummy bit line (DB/L) is made of polysilicon in which $P^+$ impurity is implanted. A contact 1 for contacting a source/drain of a cell transistor is replaced with a contact 3 for contacting a second well at a location where the dummy bit line DB/L is not overlapped with the dummy word line DW/L. The contact 3 may be used as a bulk tapping contact. Accordingly, it is not necessary to form an additional contact for the bulk tapping in other peripheral regions. Dummy cells for reducing the step difference between a memory cell array and peripheral circuit regions are used for the bulk tapping as described above. As a result, the device layout area can be reduced.

The invention has been described using exemplary preferred embodiment. However, it is to be understood that the scope and spirit of the invention are not limited to the disclosed embodiment. The scope and spirit of the invention, therefore, should be accorded the broadest interpretation so as to encompass all such modification and similar arrangement.

What is claimed is:

1. A non-volatile memory device comprising:
    a substrate of a first conductivity type;
    a first well formed in the substrate, the first well being of a second conductivity type;
    a second well formed in the first well, the second well being of the first conductivity type;
    a memory cell array having a plurality of memory cells, each cell arranged at an intersection of one of a plurality of main word lines and one of a plurality of main bit lines, the memory cell array being formed in the second well;
    a plurality of dummy bit lines adjacent to said memory cell array, at least one of the dummy bit lines including a bulk tapping contacting the second well for applying a bulk voltage thereto, and
    a plurality of dummy word lines adjacent to said memory cell array.

2. The memory device of claim 1, wherein said bulk tapping is connected to said dummy bit line to receive positive voltage.

3. The non-volatile memory device according to claim 1, wherein said plurality of dummy bit lines and said plurality of dummy word lines are arranged with the same matrix type as said plurality of main bit lines and said plurality of main word lines.

4. A non-volatile memory device comprising:
    a memory cell array having a plurality of memory cells, each cell arranged at an intersection of one of a plurality of main word lines and one of a plurality of main bit lines;

a plurality of dummy bit lines arranged parallel to the main bit lines; a plurality of dummy word lines arranged parallel to the main word lines; and a plurality of dummy cells each arranged at an intersection of one of the dummy word lines and one of the dummy bit lines, wherein at least one of the dummy cells has a source/drain region which is coupled to corresponding one of the dummy bit lines, whereby the source/drain region of the at least one of the dummy cells is used as a bulk tapping region.

5. The non-volatile memory device according to claim 4, wherein the source/drain region of the at least one of the memory cells is of the same conductivity type as a bulk region in which the memory cells are formed.

6. The non-volatile memory device according to claim 5, wherein P type impurity is implanted to the source/drain region of the at least one of the memory cells.

* * * * *